United States Patent
Li

(10) Patent No.: US 11,417,858 B2
(45) Date of Patent: Aug. 16, 2022

(54) LIGHT-EMITTING PANEL, MANUFACTURING METHOD THEREOF, AND DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventor: Zhao Li, Wuhan (CN)

(*) Notice: Subject to any disclaimer, the term of this patent is extended or adjusted under 35 U.S.C. 154(b) by 815 days.

(21) Appl. No.: 16/323,781

(22) PCT Filed: Jan. 25, 2019

(86) PCT No.: PCT/CN2019/073202
§ 371 (c)(1),
(2) Date: Feb. 7, 2019

(87) PCT Pub. No.: WO2020/113804
PCT Pub. Date: Jun. 11, 2020

(65) Prior Publication Data
US 2021/0351377 A1   Nov. 11, 2021

(30) Foreign Application Priority Data
Dec. 5, 2018   (CN) .......................... 201811482115.3

(51) Int. Cl.
*H01L 51/52* (2006.01)
*H01L 51/56* (2006.01)

(52) U.S. Cl.
CPC .......... *H01L 51/5253* (2013.01); *H01L 51/56* (2013.01); *H01L 2251/558* (2013.01)

(58) Field of Classification Search
CPC ................. H01L 51/5253; H01L 51/56; H01L 2251/558; H01L 51/5246; H01L 51/52
See application file for complete search history.

(56) References Cited

U.S. PATENT DOCUMENTS

2017/0098796 A1   4/2017   Yee
2019/0221776 A1*  7/2019   Wang ...................... H01L 51/56

FOREIGN PATENT DOCUMENTS

CN   106024834 A   10/2016
CN   207265104 U    4/2018

* cited by examiner

*Primary Examiner* — Thanh T Nguyen
(74) *Attorney, Agent, or Firm* — JMB Davis Ben-David

(57) ABSTRACT

A light-emitting panel, a method of manufacturing the light-emitting panel, and a display device include a light-emitting substrate, a first inorganic layer, an organic encapsulation layer, and a second inorganic layer laminated with each other from bottom to top in turn. The organic encapsulation layer is made of an organic ink. A moisture layer is disposed on a peripheral area of the first inorganic layer and is configured to moisten the peripheral area of the first inorganic layer so that the organic ink is evenly spread on the first inorganic layer prior to formation of the organic encapsulation layer.

9 Claims, 4 Drawing Sheets

LIGHT-EMITTING PANEL, MANUFACTURING METHOD THEREOF, AND DISPLAY DEVICE

CROSS-REFERENCE TO RELATED APPLICATIONS

This is the U.S. National Stage of International Patent Application No. PCT/CN2019/073202, filed Jan. 25, 2019, which in turn claims the benefit of Chinese Patent Application No. 2018111482115.3, filed Dec. 5, 2018.

BACKGROUND OF INVENTION

1. Field of Invention

The present application relates to a technical field of displays, and particularly to a light-emitting panel, a manufacturing method thereof, and a display device.

2. Related Art

In recent years, a rapid progress is made in organic light-emitting diode (OLED) display technology. OLED devices have attracted wide attention due to advantages of light weight, quick response times, wide viewing angles, high contrast, flexibility, and so on, and have mainly used in display technology of mobile phones, tablets, televisions, and the like.

In prior art, when OLEDs are to be encapsulated, an organic encapsulation layer is usually required to be prepared on an inorganic encapsulation layer. However, it is difficult to form the organic encapsulation layer with a uniform thickness under an existing method of forming organic encapsulation layers, which tends to give rise to a failure in encapsulation and an adverse effect on quality of OLED panels.

Therefore, it is imperative to overcome the drawbacks of the prior art.

SUMMARY OF INVENTION

The present application is to provide a light-emitting panel, a manufacturing method thereof, and a display device, capable of forming an organic encapsulation layer having a uniformity thickness, thereby to reduce an encapsulation failure rate and problems about quality of organic light-emitting diode (OLED) panels.

In a first aspect, an embodiment of the present application provides the light-emitting panel, including light-emitting substrate, a first inorganic layer, an organic encapsulation layer, and a second inorganic layer laminated with each other from bottom to top in turn, wherein the organic encapsulation layer is made of an organic ink; a moisture layer disposed on a peripheral area of the first inorganic layer and configured to moisten the peripheral area of the first inorganic layer so that the organic ink is evenly spread on the first inorganic layer prior to formation of the organic encapsulation layer.

In the light-emitting panel of the present application, the moisture layer has a vertical thickness of 0.1~2 micrometers and a horizontal width of 0.5-2 millimeters, and the organic encapsulation layer has a vertical thickness of 2-12 micrometers.

In the light-emitting panel of the present application, the moisture layer is an enclosed structure and configured to encompass the peripheral area of the first inorganic layer.

In the light-emitting panel of the present application, the moisture layer has a vertical thickness less than or equal to a vertical thickness of the organic encapsulation layer.

In the light-emitting panel of the present application, the moisture layer is made of an amphiphilic surface active material including at least one of quaternary ammonium salt, sodium dodecyl sulfate, sodium dodecyl benzene sulfonate, polyvinyl alcohol, and polyvinyl chloride.

In the light-emitting panel of the present application, the organic encapsulation layer has a vertical thickness is 2-12 micrometers.

In the light-emitting panel of the present application, an orthographic projection area of the second inorganic layer on the light-emitting substrate is greater than or equal to an orthographic projection area of the organic encapsulation layer on the light-emitting substrate.

In the light-emitting panel of the present application, the first inorganic layer and the second inorganic layer are made of silicon nitride.

In the light-emitting panel of the present application, both the first inorganic layer and the second inorganic layer have a vertical thickness of 0.1-2 micrometers.

In a second aspect, an embodiment of the present application further provides a method of manufacturing a light-emitting panel, comprising: providing a light-emitting substrate; depositing a first inorganic layer on the light-emitting substrate; forming a moisture layer on a peripheral area of the first inorganic layer, wherein the moisture layer is configured to moisten the peripheral area of the first inorganic layer; forming an organic encapsulation layer by spraying an organic ink on the first inorganic layer having the moisture layer; and depositing a second inorganic layer on the organic encapsulation layer to complete manufacturing of the light-emitting panel.

In the method of manufacturing the light-emitting panel of the present application, forming an organic encapsulation layer by spraying an organic ink on the first inorganic layer having the moisture layer comprises: spraying the organic ink on the first inorganic layer having the moisture layer; and performing an ultraviolet curing process on the organic ink to form the organic encapsulation layer.

In the method of manufacturing the light-emitting panel of the present application, the moisture layer is made of an amphiphilic surface active material including at least one of quaternary ammonium salt, sodium dodecyl sulfate, sodium dodecyl benzene sulfonate, polyvinyl alcohol, and polyvinyl chloride.

In the method of manufacturing the light-emitting panel of the present application, the organic ink is polymethacrylate organic ink.

In a third aspect, an embodiment of the present application further provides a display device comprising a casing and a light-emitting panel, the light-emitting panel mounted to the casing, the light-emitting panel comprising: a light-emitting substrate, a first inorganic layer, an organic encapsulation layer, and a second inorganic layer laminated with each other from bottom to top in turn, wherein the organic encapsulation layer is made of an organic ink; and a moisture layer disposed on a peripheral area of the first inorganic layer and configured to moisten the peripheral area of the first inorganic layer, so that the organic ink is evenly spread on the first inorganic layer prior to formation of the organic encapsulation layer, wherein the moisture layer is an enclosed structure and configured to encompass the peripheral area of the first inorganic layer, and the moisture layer has a vertical thickness less than or equal to a vertical thickness of the organic encapsulation layer.

In the display device of the present application, the moisture layer has a vertical thickness of 0.1-2 micrometers and a horizontal width of 0.5-2 millimeters, and the organic encapsulation layer has a vertical thickness of 2-12 micrometers.

In the display device of the present application, the moisture layer is made of an amphiphilic surface active material including at least one of quaternary ammonium salt, sodium dodecyl sulfate, sodium dodecyl benzene sulfonate, polyvinyl alcohol, and polyvinyl chloride.

In the display device of the present application, an orthographic projection area of the second inorganic layer on the light-emitting substrate is greater than or equal to an orthographic projection area of the organic encapsulation layer on the light-emitting substrate.

The light-emitting panel of the embodiment of the present application includes the light-emitting substrate, the first inorganic layer, the organic encapsulation layer, and the second inorganic layer laminated with each other from bottom to top in turn, wherein the organic encapsulation layer is made of an organic ink. The moisture layer is disposed on the peripheral area of the first inorganic layer and is configured to moisten the peripheral area of the first inorganic layer so that the organic ink is evenly spread on the first inorganic layer prior to formation of the organic encapsulation layer, thereby facilitating a formation of a uniformity thickness of the organic encapsulation layer and reducing an encapsulation failure rate and problems about quality of OLED panels.

BRIEF DESCRIPTION OF DRAWINGS

To describe the technical solutions in the embodiments of the present application, the following briefly introduces the accompanying drawings for describing the embodiments. Apparently, the accompanying drawings in the following description show merely some embodiments of the present application, and a person skilled in the art may still derive other drawings from these accompanying drawings without creative efforts.

DESCRIPTION OF PREFERRED EMBODIMENTS

Figure 1:
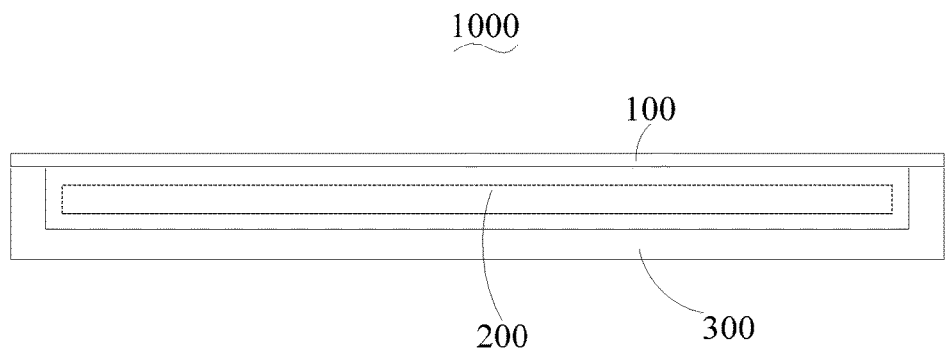
FIG. 1 is a schematic structural view of a display device in accordance with an embodiment of the present application.

The technical solutions in the embodiments of the present application will be clearly and completely described in the following with reference to the accompanying drawings in the embodiments. Apparently, the embodiments as described are only a part, but not all, of the embodiments of the present application. Based on the embodiments in the present application, all other embodiments obtained by those skilled in the art without creative efforts shall be within the scope of the present application.

In the description of the present application, it is to be understood that the term "center", "longitudinal", "lateral", "length", "width", "thickness", "upper", "lower", "front", "rear", "left", "right", "vertical", "horizontal", "top", "bottom", "inner", "outer", "clockwise", "counterclockwise" and the like indicates orientation or the orientation or positional relationship based on the positional relationship shown in the drawings, for convenience of description only and the present application is to simplify the description, but does not indicate or imply that the device or element referred to must have a particular orientation in a particular orientation construction and operation, and therefore not be construed as limiting the present application. In addition, the terms "first", "second" are used to indicate or imply relative importance or the number of technical features specified implicitly indicated the purpose of description and should not be understood. Thus, there is defined "first", "second" features may be explicitly or implicitly including one or more of the features. In the description of the new practice, the meaning of "plurality" is at least two, e.g. two, three, etc., unless explicitly specifically limited.

In the present application, unless otherwise explicitly specified or limited, the terms "mounted," "connected," "connected," "fixed" and like terms are to be broadly understood, for example, may be a fixed connection, may be is detachably connected to, or integrally; may be a mechanical connector, may be electrically connected; may be directly connected, can also be connected indirectly through intervening structures, it may be interaction between the two internal communicating elements or two elements. Those of ordinary skill in the art, to be understood that the specific meanings in the present application in accordance with specific circumstances.

In the present application, unless otherwise expressly specified or limited, the first feature being "on" or "lower" the second feature may include direct contact of the first and the second features and may also include that the first and the second features are not in direct contact, but in contact by the additional features therebetween. Also, the first feature being "on", "above", "upper" the second feature may include that the first feature is obliquely upward, directly above the second feature, or simply represent that a level of the first feature is higher than that of the second feature. The first feature being "beneath", "below" and "lower" the second feature may include that the first feature is obliquely downward and right below the second feature, or simply represent that a level of the first feature is less than that of the second feature.

The following disclosure provides many different embodiments or examples to achieve different structures of the present application. To simplify the disclosure of the present application, the components and configuration of specific examples are described hereinafter. Of course, they are only illustrative, and are not intended to limit the present application. Further, the present disclosure may repeat reference numerals in different embodiments and/or the reference letters. This repetition is for the purpose of simplicity and clarity, and does not indicate a relationship between the various embodiments and/or set in question. Further, the present application provides various specific examples of materials and processes, but one of ordinary skill in the art may be appreciated that other processes and applications and/or other materials.

In prior art, when an organic light-emitting diode (OLED) is to be encapsulated, an ink jet printing (IJP) method is usually performed by spraying printing ink on an inorganic encapsulation layer and curing the printing ink to form an organic encapsulation layer. However, it is very difficult to evenly spray the sprayed printing ink on the inorganic encapsulation layer, resulting in an uneven thickness of the organic encapsulation layer after curing, thereby tending to cause a failure in encapsulation and an adverse effect on quality of OLED panels. As a result, the present application provides a light-emitting panel, a manufacturing method thereof, and a display device which are capable of forming an organic encapsulation layer having a uniform thickness, thereby to reduce an encapsulation failure rate and problems about quality of OLED panels.

An embodiment of the present application provides a method of manufacturing a light-emitting panel. The light-emitting panel can be integrated in a display device, and the light-emitting panel can be made by using a manufacturing method of the light-emitting panel. The display device includes, but is not limited to, a smart wearable device, a smart phone, a tablet, a smart TV, and the like.

An embodiment of the present application provides a display device including a casing and a light-emitting panel. The light-emitting panel is mounted to the casing, and the light-emitting panel includes: a light-emitting substrate, a first inorganic layer, an organic encapsulation layer, and a second inorganic layer laminated with each other from bottom to top in turn, wherein the organic encapsulation layer is made of an organic ink.

A moisture layer is disposed on a peripheral area of the first inorganic layer and is configured to moisten the peripheral area of the first inorganic layer so that the organic ink is evenly spread on the first inorganic layer prior to formation of the organic encapsulation layer by the organic ink, wherein the moisture layer is an enclosed structure and configured to encompass the peripheral area of the first inorganic layer. The moisture layer has a vertical thickness less than or equal to a vertical thickness of the organic encapsulation layer.

The moisture layer has a vertical thickness of 0.1-2 micrometers and a horizontal width of 0.5-2 millimeters, and the organic encapsulation layer has a vertical thickness of 2-12 micrometers.

The moisture layer is made of an amphiphilic surface active material including at least one of quaternary ammonium salt, sodium dodecyl sulfate, sodium dodecyl benzene sulfonate, polyvinyl alcohol, and polyvinyl chloride.

An orthographic projection area of the second inorganic layer on the light-emitting substrate is greater than or equal to an orthographic projection area of the organic encapsulation layer on the light-emitting substrate.

Please refer to FIG. 1. FIG. 1 is a schematic structural view of a display device 1000 in accordance with an embodiment of the present application. The display device 1000 includes a light-emitting panel 100, a control circuit 200, and a casing 300. It should be noted that the display device 1000 as shown in FIG. 1 is not limited to the above content, and may further include other components, such as a camera, an antenna structure, a fingerprint unlocking module, and the like.

The light-emitting panel 100 is disposed on the casing 300.

In certain embodiments, the light-emitting panel 100 is mounted to the casing 300, and the light-emitting panel 100 and the casing jointly form a sealed space to accommodate components, such as the control circuit 200 and so on.

In certain embodiments, the casing 300 is made of a flexible material, such as a plastic casing or a silicone casing.

The control circuit 200 is assembled in the casing 300 and is exemplified as a main board of the display device 1000. The control circuit 200 can integrate one, two, or more of a battery, an antenna structure, a microphone, a speaker, a headphone interface, a universal serial bus interface, a camera, a distance sensor, an ambient light sensor, a receiver, and a processor.

The light-emitting panel 100 is mounted to the casing 300. At the same time, the light-emitting panel 100 electrically connects to the control circuit 200 to form a display surface of the display device 1000. The light-emitting panel 100 includes a display area and a non-display area. The display area is configured to display images of the display device 1000, or to provide touch control for users. The non-display area is configured to accommodate various functional components.

Figure 2:
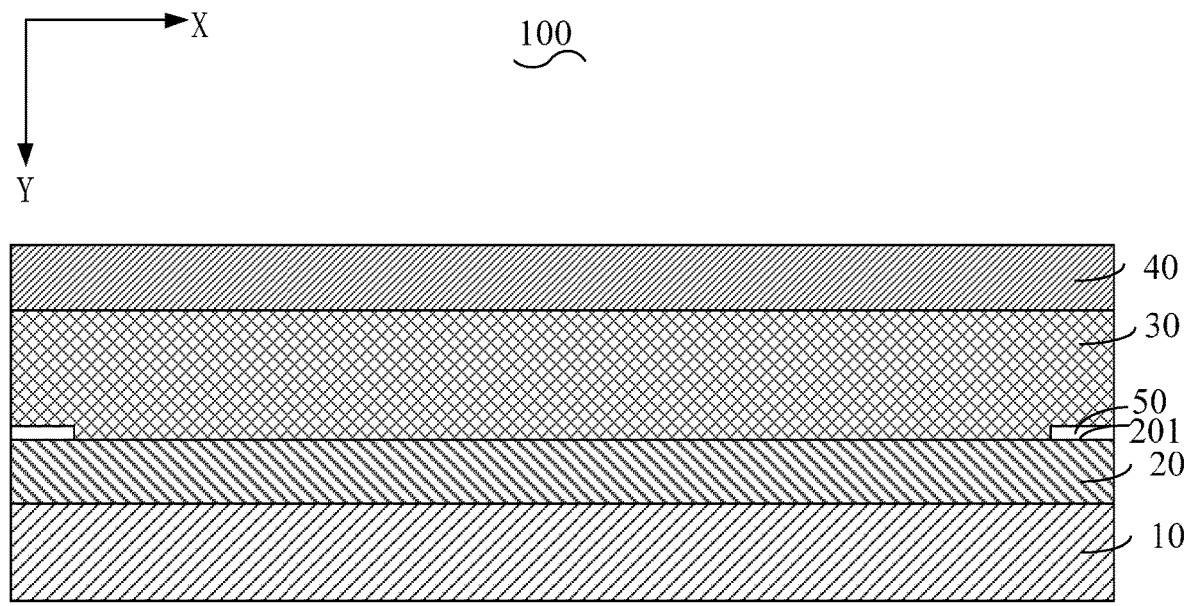
FIG. 2 is a schematic sectional structural view of a light-emitting panel in accordance with an embodiment of the present application.
Figure 3:
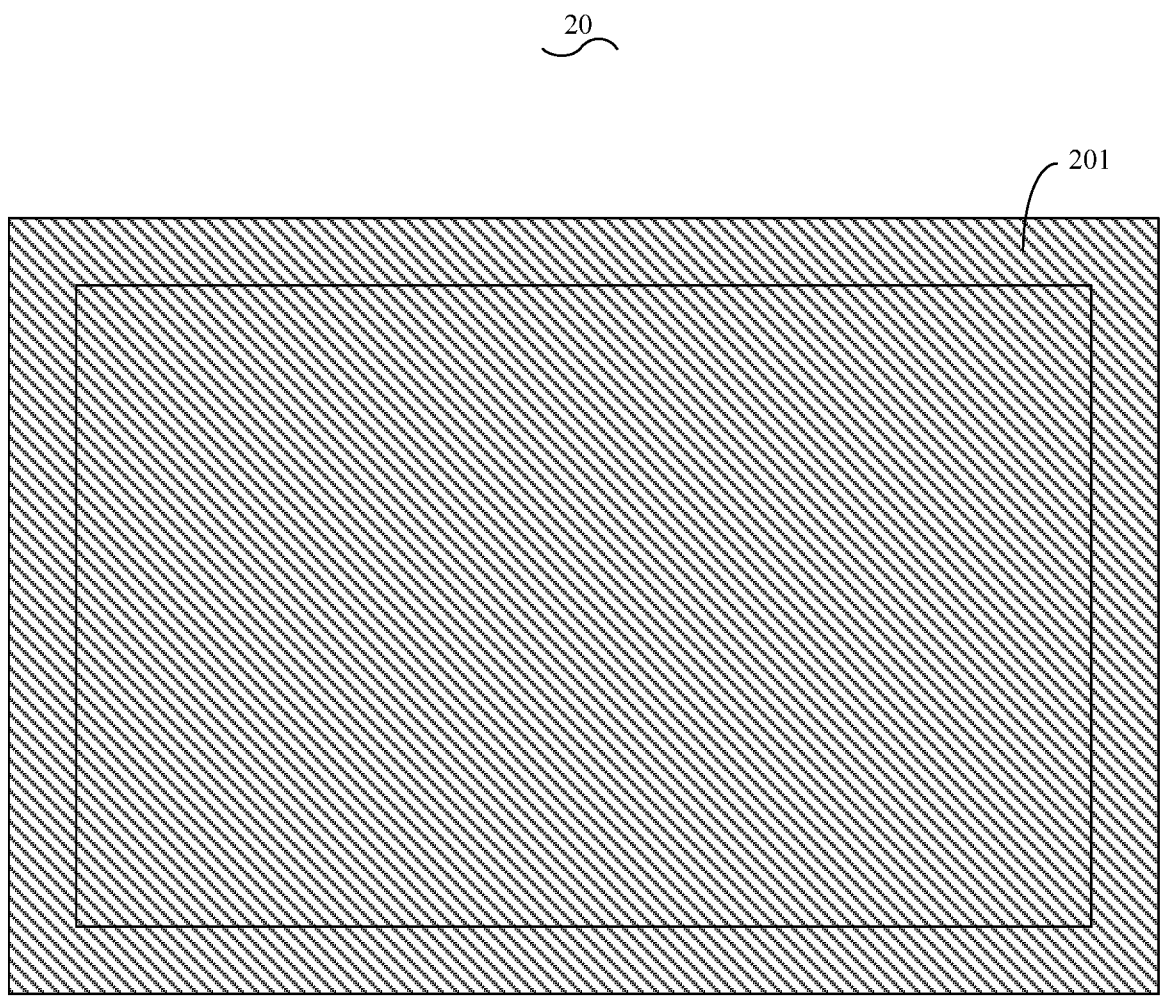
FIG. 3 is a schematic structural view of a first inorganic layer of a light-emitting panel of an embodiment of the present application.
Figure 4:
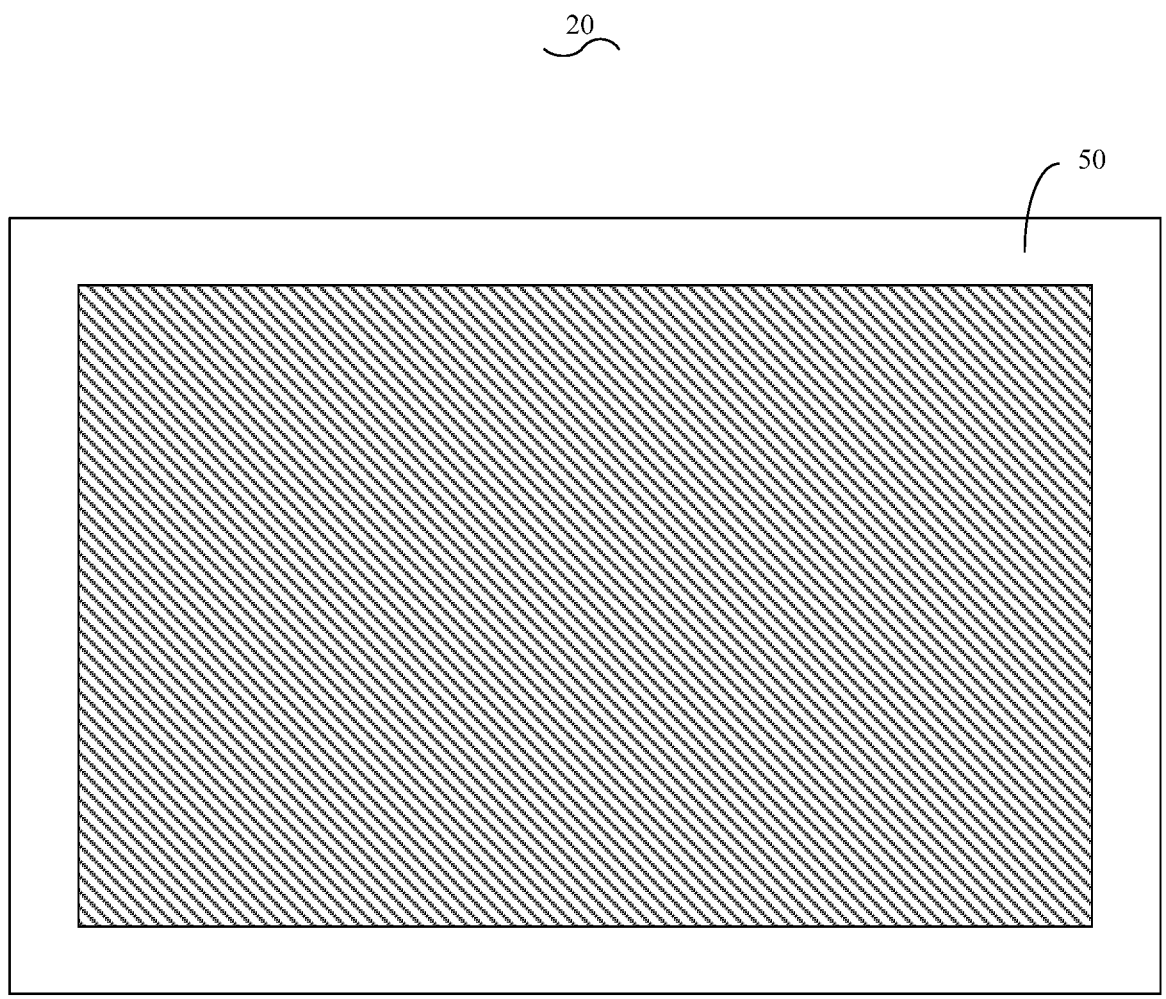
FIG. 4 is a schematic structural view of a first inorganic layer of a light-emitting panel having a moisture layer of an embodiment of the present application.

Further, please refer to FIGS. 2 to 4. FIG. 2 is a schematic sectional structural view of a light-emitting panel in accordance with an embodiment of the present application. FIG. 3 is a schematic structural view of a first inorganic layer of a light-emitting panel of an embodiment of the present application. FIG. 4 is a schematic structural view of a first inorganic layer of a light-emitting panel having a moisture layer of an embodiment of the present application.

The light-emitting panel 100 includes a light-emitting substrate 10, a first inorganic layer 20, an organic encapsulation layer 30, and a second inorganic layer 40 laminated with each other from bottom to top in turn, wherein the organic encapsulation layer 30 is made of an organic ink.

A moisture layer 50 is disposed on a peripheral area 201 of the first inorganic layer 20 and is configured to moisten the peripheral area 201 of the first inorganic layer 20 so that the organic ink is evenly spread on the first inorganic layer 20 prior to formation of the organic encapsulation layer 30.

It can be understood that the light-emitting panel 100 is composed of the light-emitting substrate 10, the first inorganic layer 20, the organic encapsulation layer 30, and the second inorganic layer 40. Since the organic encapsulation layer 30 is made of an organic ink and the organic ink is hydrophobic, therefore, when sprays the organic ink, it is very difficult to completely evenly spread the hydrophobic organic ink on the hydrophilic first inorganic layer 20. Thus, the moisture layer 50 is disposed on the peripheral area 201 of the first inorganic layer 20 and is configured to moisten the peripheral area 201 of the first inorganic layer 20. According to a similar compatibility principle, when being sprayed, the organic ink can be diffused and leveled around the first inorganic layer 20, so that the organic encapsulation layer 30 formed so has a uniform thickness.

The organic ink is polymethacrylate organic ink. The organic encapsulation layer 30 can be formed by a method using IJP, and the sprayed organic ink is subjected to an ultraviolet curing treatment to form the organic encapsulation layer 30.

A light-emitting panel 100 of an embodiment of the present application includes a light-emitting substrate 10, a first inorganic layer 20, an organic encapsulation layer 30, and a second inorganic layer 40 laminated with each other from bottom to top in turn, wherein the organic encapsulation layer 30 is made of an organic ink. A moisture layer 50 is disposed on a peripheral area 201 of the first inorganic layer 20 and is configured to moisten the peripheral area 201 of the first inorganic layer 20 so that the organic ink is evenly spread on the first inorganic layer 20 prior to formation of the organic encapsulation layer 30, thereby facilitating formation of a uniform thickness of the organic encapsulation layer 30, and reducing an encapsulation failure rate and problems about quality of OLED panels.

In certain embodiments, the moisture layer is an enclosed structure and configured to encompass the peripheral area of the first inorganic layer.

Specifically, because the peripheral area 201 of the first inorganic insulation layer 20 is an enclosed surface, the moisture layer 50 disposed on the enclosed surface is a corresponding enclosed structure to enclose the peripheral area 201 of the first inorganic insulation layer 20.

In certain embodiments, the moisture layer is made of an amphiphilic surface active material including at least one of quaternary ammonium salt, sodium dodecyl sulfate, sodium dodecyl benzene sulfonate, polyvinyl alcohol, and polyvinyl chloride.

In certain embodiments, the first inorganic layer and the second inorganic layer are made of silicon nitride.

In certain embodiments, the first inorganic layer 20 and the second inorganic layer 40 are prepared through chemical vapor deposition (CVD), inasmuch as a process of introducing a vapor containing a gaseous reactant or a liquid reactant constituting a thin film element and other gases required for the reaction into a reaction chamber to form a chemical reaction on a surface of the substrate to form a thin film. After the CVD treatment, a surface treatment film adhesion is increased by about 30%, and scratches caused by bending, stretching, and the like of high-strength steel are prevented. The first inorganic layer 20 and the second inorganic layer 40 can be made of silicon nitride.

In certain embodiments, both first inorganic layer and the second inorganic layer have a vertical thickness of 0.1-2 micrometers.

Figure 5:
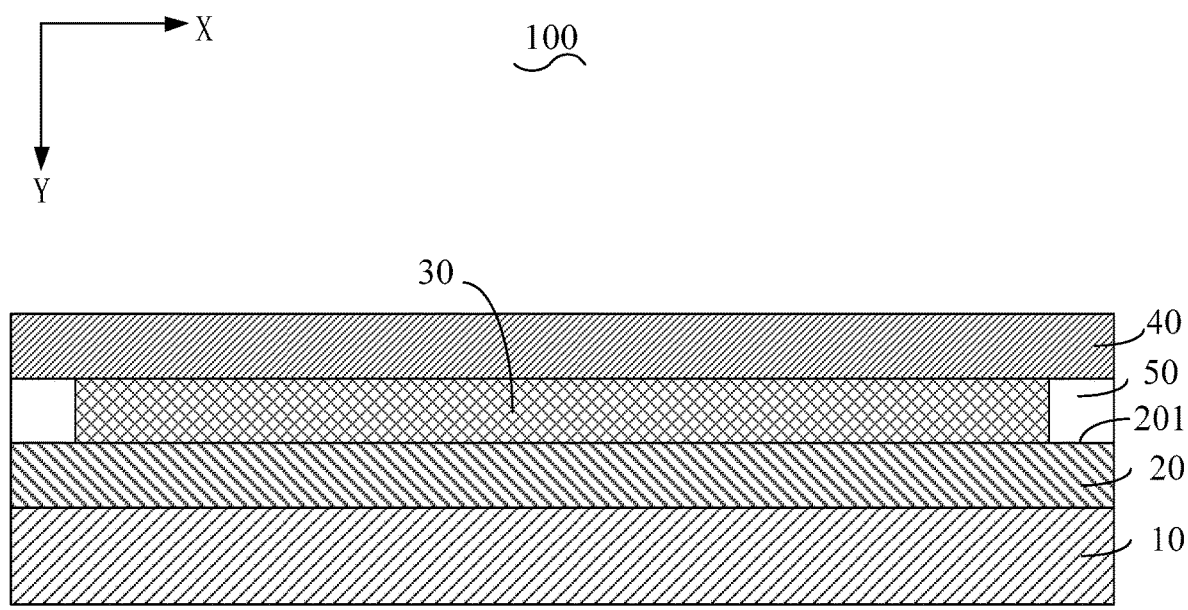
FIG. 5 is another schematic sectional structural view of a light-emitting panel in accordance with an embodiment of the present application.

Specifically, please refer to FIGS. 2 and 5. FIG. 5 is another schematic sectional structural view of a light-emitting panel in accordance with an embodiment of the present application.

In certain embodiments, a vertical thickness of the moisture layer is less than or equal to a vertical thickness of the organic encapsulation layer.

In certain embodiments, the moisture layer has a vertical thickness of 0.1-2 micrometers.

In certain embodiments, the organic encapsulation layer has a vertical thickness of 2-12 micrometers.

In certain embodiments, the orthographic projection area of the second inorganic layer on the light-emitting substrate is greater than or equal to the orthographic projection area of the organic encapsulation layer on the light-emitting substrate.

As shown in FIG. 2, X represents a horizontal direction and Y represents a vertical direction. Thickness of the moisture layer 50 in the Y direction is less than thickness of the organic encapsulation layer 30 in the Y direction. The orthographic projection area of the second inorganic layer 40 on the light-emitting substrate 10 is equal to the orthographic projection area of the organic encapsulation layer 30 on the light-emitting substrate 10. The moisture layer 50 has a thickness of 0.12 micrometers in the Y direction, and the organic encapsulation layer 30 has a thickness of 212 micrometers in the Y direction. In this manner, the organic encapsulation layer 30 has a T-shaped structure.

As shown in FIG. 5, X represents a horizontal direction and Y represents a vertical direction. In FIG. 5, the moisture layer 50 has a thickness of 2 micrometers in the Y direction, and the organic encapsulation layer 30 has a thickness of 2 micrometers in the Y direction. In this manner, the thickness of the moisture layer 50 in the Y direction is same as that of the organic encapsulation layer 30 in the Y direction, and the orthographic projection area of the second inorganic layer 40 on the light-emitting substrate 10 is greater than the orthographic projection area of the organic encapsulation layer 30 on the light-emitting substrate 10. In this manner, the organic encapsulation layer 30 has a square structure, wherein the moisture layer 50 has a horizontal width of 0.5-2 millimeters in the X direction.

A light-emitting panel 100 of an embodiment of the present application includes a light-emitting substrate 10, a first inorganic layer 20, an organic encapsulation layer 30, and a second inorganic layer 40 laminated with each other from bottom to top in turn, wherein the organic encapsulation layer 30 is made of an organic ink. A moisture layer 50 is disposed on a peripheral area 201 of the first inorganic layer 20 and is configured to moisten the peripheral area 201 of the first inorganic layer 20 so that the organic ink is evenly spread on the first inorganic layer 20 prior to formation of the organic encapsulation layer 30, thereby facilitating formation of a uniform thickness of the organic encapsulation layer 30, and reducing an encapsulation failure rate and problems about quality of OLED panels.

In order to further describe the present application, the following description is made in terms of a method of manufacturing a light-emitting panel.

providing a light-emitting substrate;

depositing a first inorganic layer on the light-emitting substrate;

forming a moisture layer on a peripheral area of the first inorganic layer, wherein the moisture layer is configured to moisten the peripheral area of the first inorganic layer;

forming an organic encapsulation layer by spraying an organic ink on the first inorganic layer having the moisture layer; and depositing a second inorganic layer on the organic encapsulation layer to complete manufacturing of the light-emitting panel.

It can be understood that the light-emitting panel is composed of the light-emitting substrate, the first inorganic layer, the organic encapsulation layer, and the second inorganic layer. Since the organic encapsulation layer is made of an organic ink and the organic ink is hydrophobic, therefore, when sprays the organic ink, it is very difficult to completely evenly spread the hydrophobic organic ink on the hydrophilic first inorganic layer. Thus, the moisture layer is disposed on the peripheral area of the first inorganic layer and is configured to moisten the peripheral area of the first inorganic layer. According to a similar compatibility principle, when being sprayed, the organic ink can be diffused and leveled around the first inorganic layer, so that the organic encapsulation layer formed so has a uniform thickness.

In certain embodiments of the present application, forming the organic encapsulation layer by spraying the organic ink on the first inorganic layer having the moisture layer includes: spraying the organic ink on the first inorganic layer having the moisture layer and performing the ultraviolet curing process on the organic ink to form the organic encapsulation layer.

In certain embodiments of the present application, the organic ink is polymethacrylate organic ink, wherein the organic encapsulation layer can be formed by the method using IJP, and the sprayed organic ink is subjected to the ultraviolet curing treatment to form the organic encapsulation layer.

In certain embodiments of the present application, the moisture layer is made of an amphiphilic surface active material including at least one of quaternary ammonium salt, sodium dodecyl sulfate, sodium dodecyl benzene sulfonate, polyvinyl alcohol, and polyvinyl chloride.

The method of manufacturing the light-emitting panel of the embodiment of the present application is utilized in the display device and provides the moisture layer disposed on the peripheral area of the first inorganic layer. The moisture layer is configured to moisten the peripheral area of the first inorganic layer and therefore allows the organic ink to be evenly spread on the first inorganic layer prior to formation of the organic encapsulation layer, thereby facilitating formation of a uniform thickness of the organic encapsulation layer, and reducing an encapsulation failure rate and problems about quality of OLED panels.

In the above embodiments, the descriptions of the various embodiments are all focused on, and the parts that are not detailed in a certain embodiment can be referred to the related descriptions of other embodiments.

The light-emitting panel, the manufacturing method thereof, and the display device provided by the embodiments of the present application are described in detail above. The exemplary embodiments described herein are to be considered as illustrative only, and are not intended to limit the invention. Descriptions of features or aspects in each exemplary embodiment should generally be considered as suitable features or aspects in other exemplary embodiments. While the invention has been described with reference to the preferred embodiments thereof, various modifications and changes can be made by those skilled in the art. The invention is intended to cover such modifications and modifications within the scope of the appended claims.

What is claimed is:

1. A light-emitting panel, comprising:
   a light-emitting substrate, a first inorganic layer, an organic encapsulation layer, and a second inorganic layer laminated with each other from bottom to top in turn, wherein the organic encapsulation layer is made of an organic ink;
   a moisture layer disposed on and encompass a peripheral area of the first inorganic layer such that the moisture layer defines an enclosed structure enclosing the organic ink and moistening the peripheral area of the first inorganic layer so that the organic ink is evenly spread on the first inorganic layer prior to formation of the organic encapsulation layer;
   wherein an orthographic projection of the organic encapsulation layer within the enclosed structure of the moisture layer on the light-emitting substrate does not coincide with an orthographic projection of the moisture layer on the light-emitting substrate.

2. The light-emitting panel of claim 1, wherein the moisture layer has a vertical thickness of 0.1-2 micrometers and a horizontal width of 0.5-2 millimeters, and the organic encapsulation layer has a vertical thickness of 2-12 micrometers.

3. The light-emitting panel of claim 1, wherein the moisture layer has a vertical thickness less than or equal to a vertical thickness of the organic encapsulation layer.

4. The light-emitting panel of claim 3, wherein the moisture layer is made of an amphiphilic surface active material including at least one of quaternary ammonium salt, sodium dodecyl sulfate, sodium dodecyl benzene sulfonate, polyvinyl alcohol, and polyvinyl chloride.

5. The light-emitting panel of claim 1, wherein an orthographic projection area of the second inorganic layer on the light-emitting substrate is greater than or equal to an orthographic projection area of the organic encapsulation layer on the light-emitting substrate.

6. A display device comprising a casing and a light-emitting panel, the light-emitting panel mounted to the casing, the light-emitting panel comprising:
   a light-emitting substrate, a first inorganic layer, an organic encapsulation layer, and a second inorganic layer laminated with each other from bottom to top in turn, wherein the organic encapsulation layer is made of an organic ink; and
   a moisture layer disposed on and encompass a peripheral area of the first inorganic layer such that the moisture layer defines an enclosed structure enclosing the organic ink and moistening the peripheral area of the first inorganic layer, so that the organic ink is evenly spread on the first inorganic layer prior to formation of the organic encapsulation layer, wherein the moisture layer has a vertical thickness less than or equal to a vertical thickness of the organic encapsulation layer, and an orthographic projection of the organic encapsulation layer within the enclosed structure of the moisture layer on the light-emitting substrate does not coincide with an orthographic projection of the moisture layer on the light-emitting substrate.

7. The display device of claim 6, wherein the moisture layer has a vertical thickness of 0.1-2 micrometers and a horizontal width of 0.5-2 millimeters, and the organic encapsulation layer has a vertical thickness of 2-12 micrometers.

8. The display device of claim 6, wherein the moisture layer is made of an amphiphilic surface active material including at least one of quaternary ammonium salt, sodium dodecyl sulfate, sodium dodecyl benzene sulfonate, polyvinyl alcohol, and polyvinyl chloride.

9. The display device of claim 6, wherein an orthographic projection area of the second inorganic layer on the light-emitting substrate is greater than or equal to an orthographic projection area of the organic encapsulation layer on the light-emitting substrate.

* * * * *